(12) United States Patent
Shanker et al.

(10) Patent No.: US 9,245,744 B2
(45) Date of Patent: Jan. 26, 2016

(54) COMBINATORIAL PLASMA ENHANCED DEPOSITION AND ETCH TECHNIQUES

(71) Applicant: Intermolecular, Inc., San Jose, CA (US)

(72) Inventors: Sunil Shanker, Santa Clara, CA (US); Tony P. Chiang, Campbell, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 100 days.

(21) Appl. No.: 14/253,712

(22) Filed: Apr. 15, 2014

(65) Prior Publication Data

US 2014/0227880 A1  Aug. 14, 2014

Related U.S. Application Data

(63) Continuation of application No. 12/963,995, filed on Dec. 9, 2010, now Pat. No. 8,726,838.

(60) Provisional application No. 61/319,841, filed on Mar. 31, 2010.

(51) Int. Cl.
| | |
|---|---|
| *C23C 16/50* | (2006.01) |
| *C23C 16/509* | (2006.01) |
| *H01L 21/02* | (2006.01) |
| *C23C 16/44* | (2006.01) |
| *C23C 16/455* | (2006.01) |
| *H01J 37/32* | (2006.01) |
| *C23C 16/02* | (2006.01) |
| *C23C 16/458* | (2006.01) |
| *H01L 21/67* | (2006.01) |
| *H01L 21/3065* | (2006.01) |

(52) U.S. Cl.
CPC ...... *H01L 21/02274* (2013.01); *C23C 16/0227* (2013.01); *C23C 16/44* (2013.01); *C23C 16/4586* (2013.01); *C23C 16/45523* (2013.01); *C23C 16/45525* (2013.01); *C23C 16/45536* (2013.01); *C23C 16/45548* (2013.01); *C23C 16/45565* (2013.01); *C23C 16/45574* (2013.01); *C23C 16/509* (2013.01); *C23C 16/5096* (2013.01); *H01J 37/3244* (2013.01); *H01J 37/32091* (2013.01); *H01J 37/32532* (2013.01); *H01J 37/32541* (2013.01); *H01J 37/32568* (2013.01); *H01J 37/32715* (2013.01); *H01J 37/32779* (2013.01); *H01L 21/3065* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 2002/0094591 | A1* | 7/2002 | Sill | H01J 37/321 438/14 |
| 2009/0275210 | A1* | 11/2009 | Shanker | C23C 16/04 438/761 |
| 2010/0080933 | A1* | 4/2010 | Kudela | H01J 37/32752 427/574 |

* cited by examiner

*Primary Examiner* — Mandy Louie

(57) ABSTRACT

According to various embodiments of the disclosure, an apparatus and method for enhanced deposition and etch techniques is described, including a pedestal, the pedestal having at least two electrodes embedded in the pedestal, a showerhead above the pedestal, a plasma gas source connected to the showerhead, wherein the showerhead is configured to deliver plasma gas to a processing region between the showerhead and the substrate and a power source operably connected to the showerhead and the at least two electrodes with plasma being substantially contained in an area which corresponds with one electrode of the at least two electrodes.

20 Claims, 12 Drawing Sheets

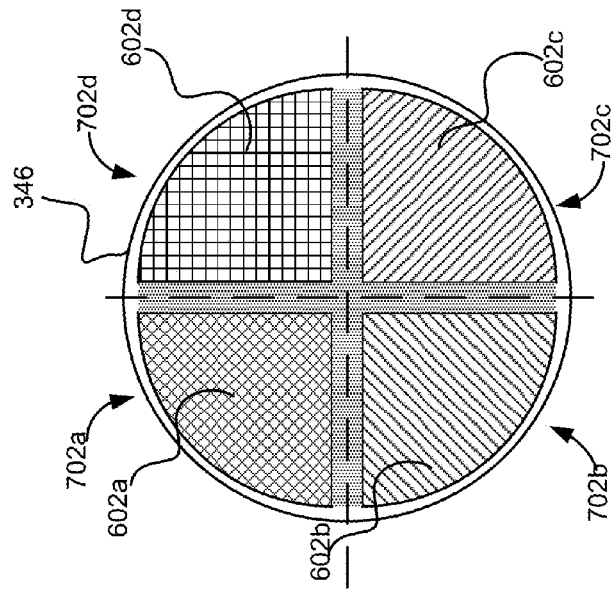
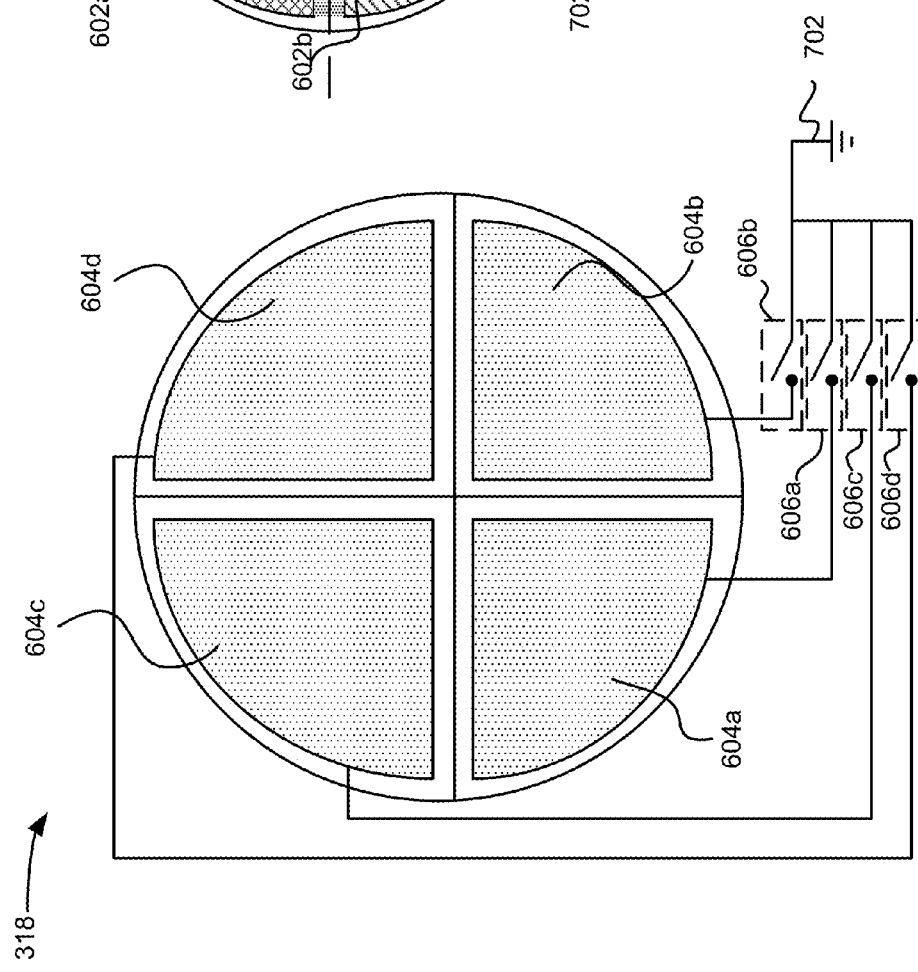

US 9,245,744 B2

COMBINATORIAL PLASMA ENHANCED DEPOSITION AND ETCH TECHNIQUES

CROSS-REFERENCE TO RELATED APPLICATIONS

This is a Continuation application of U.S. patent application Ser. No. 12/963,995, filed on Dec. 9, 2010, which claims priority under 35 U.S.C. §119 to U.S. Provisional Application No. 61/319,841, filed on Mar. 31, 2010, each of which is hereby incorporated by reference in its entirety for all purposes.

The present application is related to U.S. patent application Ser. No. 12/433,842 (now U.S. Pat. No. 8,129,288) filed Apr. 30, 2009, which is herein incorporated by reference for all purposes, U.S. patent application Ser. No. 12/013,729 (now U.S. Pat. No. 8,440,259) filed Jan. 14, 2008, which is herein incorporated by reference for all purposes, U.S. patent application Ser. No. 12/013,759 (now U.S. Pat. No. 8,334,015) filed Jan. 14, 2008, which is herein incorporated by reference for all purposes, and U.S. patent application Ser. No. 12/205,578 filed Sep. 5, 2008, which is herein incorporated by reference for all purposes.

TECHNICAL FIELD

The present disclosure relates generally to semiconductor processing. More specifically, an apparatus and method for combinatorial plasma enhanced deposition and etch techniques on a substrate are described.

BACKGROUND

Substrate processing may include deposition and etch processes on a substrate. Deposition processes may include chemical vapor deposition (CVD) and atomic layer deposition (ALD). Chemical vapor deposition (CVD) is a process used to deposit thin films for semiconductor fabrication. CVD typically includes introducing one or more reagents (e.g., precursors) to a substrate in a processing chamber. The reagents react and/or decompose to deposit the films. Longer CVD processing times (i.e., longer exposure to reagents) increase layer thickness. Plasma enhanced CVD (PECVD) uses plasma in the processing chamber to increase the reaction rates of the reagents and may allow deposition at lower temperatures. Plasma species can also be used to modify resulting film properties.

Atomic layer deposition (ALD) is a process used to deposit conformal layers with atomic scale thickness control during various semiconductor processing operations. ALD may be used to deposit barrier layers, adhesion layers, seed layers, dielectric layers, conductive layers, and the like. ALD is a multi-step self-limiting process that includes the use of at least two reagents. Generally, a first reagent (which may be referred to as a precursor) is introduced into a processing chamber containing a substrate and adsorbs on the surface of the substrate. Excess precursor is purged and/or pumped away. A second reagent (e.g., water vapor, ozone, or plasma) is then introduced into the chamber and reacts with the adsorbed layer to form a deposited layer via a deposition reaction. The deposition reaction is self-limiting in that the reaction terminates once the initially adsorbed layer is fully reacted with the second reagent. Excess second reagent is then purged and/or pumped away. The aforementioned steps constitute one deposition or ALD "cycle." The process is repeated to form the next layer, with the number of cycles determining the total deposited film thickness. Plasma enhanced ALD (PEALD) is a variant of ALD that uses plasma as the second reagent, where plasma constitutes a quasi-static equilibrium of ions, radicals and neutrals derived from the constituent feed gasses.

CVD and ALD can be performed using a processing chamber that includes a showerhead disposed above a substrate. Reagents may be introduced to the substrate through the showerhead. For plasma enhanced processes, plasma can be generated using a radio frequency (RF) or direct current (DC) discharge between two conductive surfaces (e.g. electrodes) in the chamber. The discharge is used to ignite reacting gasses in the chamber.

Etching can also be performed using a processing chamber that includes a showerhead disposed above a substrate. Reagents, including etch gases, may be introduced to the substrate through the showerhead. For plasma enhanced processes, plasma gas may be introduced into the chamber and reacts with the etch gases to pre-treat or etch one or more materials on a substrate. Plasma can be generated using a radio frequency (RF) or direct current (DC) discharge between two conductive surfaces (e.g. electrodes) in the chamber.

Semiconductor research and development is typically performed by using production tools. Therefore, to explore new CVD and ALD techniques or to evaluate materials deposited using CVD or ALD, a layer is deposited over an entire wafer. Similarly, to explore new etch techniques, an entire substrate is grounded and plasma energy is focused on an entire wafer. The process of investigating semiconductor processes and materials in this way can be slow and expensive.

BRIEF DESCRIPTION OF THE DRAWINGS

Various embodiments of the invention are disclosed in the following detailed description and the accompanying drawings:

FIG. 7A is an overhead view of a pedestal of the substrate processing system of FIGS. 6A and 6B.

FIG. 7B illustrates a substrate having multiple regions with different materials deposited thereon.

DETAILED DESCRIPTION

Figure 1:
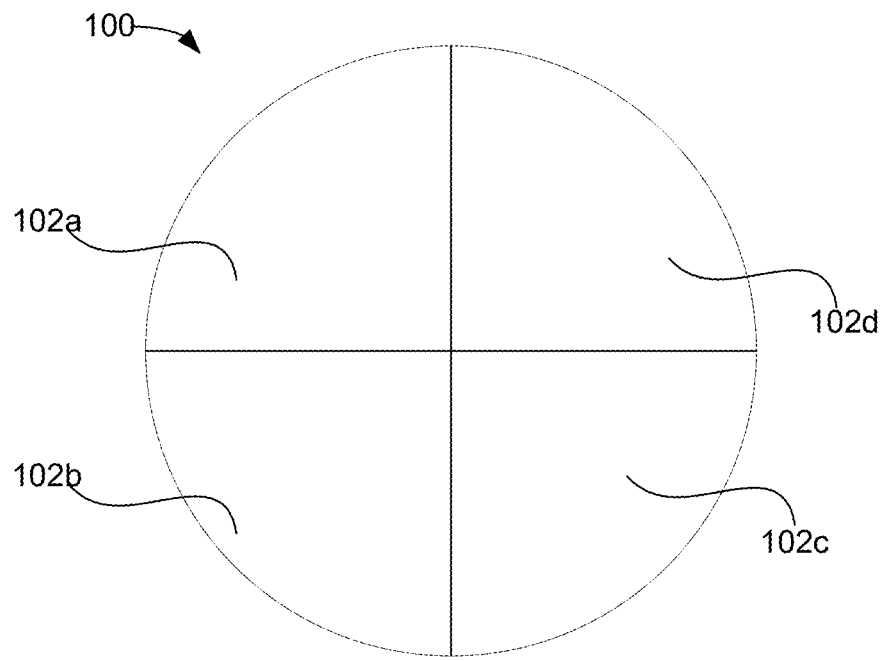
FIG. 1 illustrates a substrate having multiple regions.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments described herein, a processing system includes a showerhead disposed above a pedestal which may support a substrate placed upon the pedestal to perform processing such as pre-processing, pre-treatment, etch, chemical vapor deposition (CVD), atomic layer deposition (ALD), post-processing and the like. The processing system can etch and deposit materials on multiple regions of a substrate. Combinatorial processing may include presence or absence of plasma as a processing reagent (e.g. an oxidizer) in multiple regions of a substrate. Additionally, one material may be utilized to etch or deposit on one region using a first set of processing parameters and a second material may be utilized to etch or deposit on another region using a second set of processing parameters, such as the presence or absence of plasma. Plasma can be activated in some regions of the substrate and not in others by using a processing system including a pedestal to hold the substrate that includes electrodes embedded in the pedestal. Plasma can be activated by completing a circuit through electrodes corresponding to regions of the substrate in which it is desired to use plasma. Additionally, in some embodiments, plasma can be applied to all regions of a substrate, using different plasma parameters (e.g. different gasses, voltages, flow rates, and the like) to vary characteristics of the materials formed across the different regions. Advantageously, different materials and processes may be tested in a quick and efficient manner due to the ability to apply different plasma parameters within regions of a substrate.

I. Combinatorial Processing

"Combinatorial Processing" generally refers to techniques of differentially processing multiple regions of a substrate. Combinatorial processing can be used to produce and evaluate different materials, chemicals, processes, and techniques related to semiconductor fabrication as well as build structures or determine how the above coat, fill, etch or interact with existing structures. Combinatorial processing varies materials, unit processes and/or process sequences across multiple regions on a substrate.

A. Multiple Regions on a Substrate

FIG. 1 illustrates a substrate 100 having multiple regions. The substrate 100 includes multiple wedge-shaped regions 102. The wedge shaped-regions 102 can be formed using techniques such as etch, plasma etch, CVD, ALD, PECVD, and PEALD. For example, a different material or materials having different properties can be deposited in each of the regions 102 by varying the precursors, plasma gasses, reagents, exposure time, temperature, pressure, or other processing parameters or conditions. The regions 102 can then be examined and compared to determine which of the materials or techniques merits further study or is useful for production. Although, as shown here, the substrate 100 is divided into four wedge-shaped regions (e.g. "quadrants"), it is understood that any number of regions having any shape may be used. Additionally, the substrate 100 is a circular wafer; however any shape or size of substrate may be used, including rectangular coupons that are diced from larger wafers. The substrates or wafers may be used in integrated circuits, semiconductor devices, flat panel displays, optoelectronic devices, data storage devices, magnetoelectronic devices, magnetooptic devices, molecular electronic devices, solar cells, photonic devices, packaged devices, and the like.

As an example, two precursors can be used to deposit two different materials on the substrate 100. A first precursor A can be used to deposit, for example, aluminum in regions 102a and 102b, and a second precursor B can be used to deposit, for example, manganese in regions 102c and 102d. The precursor A can have a different exposure time, flow rate, and the like in region 102a than in region 102b. Additionally, one or more regions may use plasma as an enhancement or a reagent. The description below includes embodiments for providing plasma to a portion of a substrate. In other embodiments, the same precursors or materials can be used in multiple regions (e.g. the same precursor is used in two regions), while some regions have plasma and others use another reagent. In addition, other process parameters (e.g. flow, pressure and the like) can be varied across regions.

In some embodiments, plasma can be applied to the entire substrate 100, and the plasma can have different properties across the different regions 102. For example, the plasma can be formed using different plasma gasses (e.g. He in region 102a, $O_2$ in region 102b, and Ar in region 102c) to study effects of using different types of plasma. Using multiple types of plasma on a single substrate 100 can significantly reduce processing times when evaluating multiple plasma parameters.

A unit process is an individual process used for semiconductor fabrication. Examples of unit processes for CVD and ALD processing include introducing a reagent or precursor, purging, and applying a potential between two electrodes. A process sequence is the sequence of individual unit processes used to perform a semiconductor process (e.g., to deposit a layer). Examples of unit processes for etch processing including use of a material, such as etch gasses, (e.g. NF3) to perform selective plasma etching of portions or regions of a substrate. Unit processes for etch processing may be performed without a change in the tools and associated hardware.

Using combinatorial processing, any of the materials, unit processes, or process sequences can be varied across regions of one or more substrates. As examples:

Different materials (or similar materials having different characteristics) can be deposited on different regions 102 of one or more substrates. In some embodiments, the same materials can be deposited using different reagents, for example by using the same precursor across all regions and using different types of plasma in some regions. In one example, a hafnium precursor can be flowed into all regions 102, and different plasma gasses (e.g. Ar, He, $O_2$) are flowed into each of the different regions 102.

Different unit processes can be performed across regions, or variations of unit processes (e.g., expose a precursor for 10 seconds on one region and 20 seconds on another) can be performed.

The order of unit processes, e.g., the sequence of individual unit processes used to deposit one or more layers can be changed. Additionally, unit processes can be added to or omitted from process sequences.

B. Combinatorial Evaluation

Figure 2:
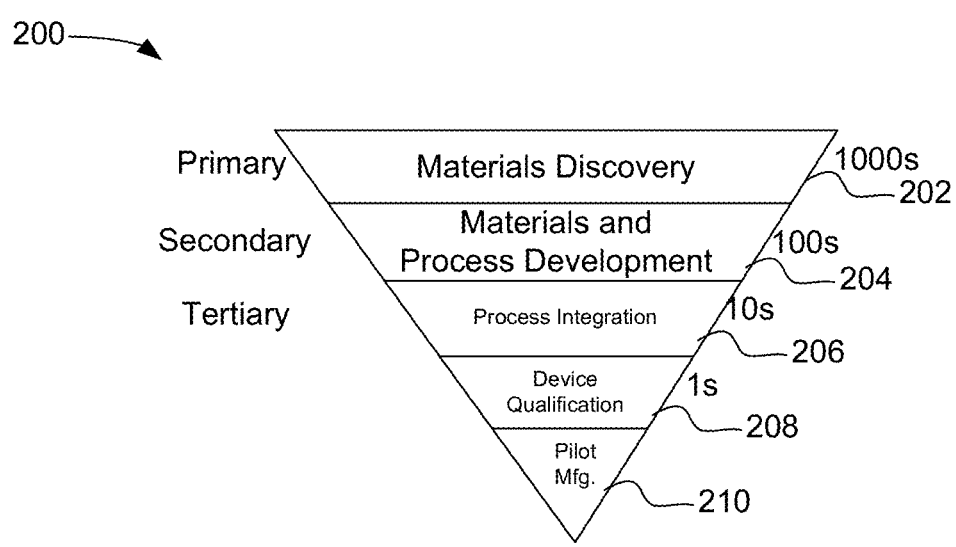
FIG. 2 is a schematic diagram illustrating an implementation of combinatorial processing and evaluation.

FIG. 2 is a schematic diagram 200 illustrating an implementation of combinatorial processing and evaluation. The schematic diagram 200 generally describes various levels of combinatorial processing. For example, a combinatorial evaluation can include several stages 202-210, each including the processing of several regions of one or more substrates. The schematic diagram 200 illustrates that the relative number of combinatorial processes run with a group of substrates decreases as certain materials and/or processes are selected. Generally, combinatorial processing includes performing a large number of processes and materials choices during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 202. Materials discovery stage 202 is also known as a primary screening stage performed using primary screening techniques. Primary screening techniques may include dividing substrates into regions and depositing materials using varied processes. The materials are then evaluated, and promising candidates are advanced to the secondary screen, or materials and process development stage 204. Evaluation of the materials is performed using metrology tools such as physical and electronic testers and imaging tools.

The materials and process development stage 204 may evaluate hundreds of materials (i.e., a magnitude smaller than the primary stage) and may focus on the processes used to etch, deposit or develop those materials. Promising materials and processes are again selected, and advanced to the tertiary screen or process integration stage 206, where tens of materials and/or processes and combinations are evaluated. The tertiary screen or process integration stage 206 may focus on integrating the selected processes and materials with other processes and materials into structures.

The most promising materials and processes from the tertiary screen are advanced to device qualification 208. In device qualification, the materials and processes selected are evaluated for high volume manufacturing, which normally is conducted on full wafers within production tools, but need not be conducted in such a manner. The results are evaluated to determine the efficacy of the selected materials, processes, and integration. If successful, the use of the screened materials and processes can proceed to manufacturing 210. As is used herein "materials" can be considered different if they are formed using different processing parameters.

The schematic diagram 200 is an example of various techniques that may be used to evaluate and select materials, processes, and integration for the development of semiconductor devices. The descriptions of primary, secondary, etc. screening and the various stages 202-210 are arbitrary and the stages may overlap, occur out of sequence, be described and be performed in many other ways.

II. Combinatorial Processing System

Figure 3:
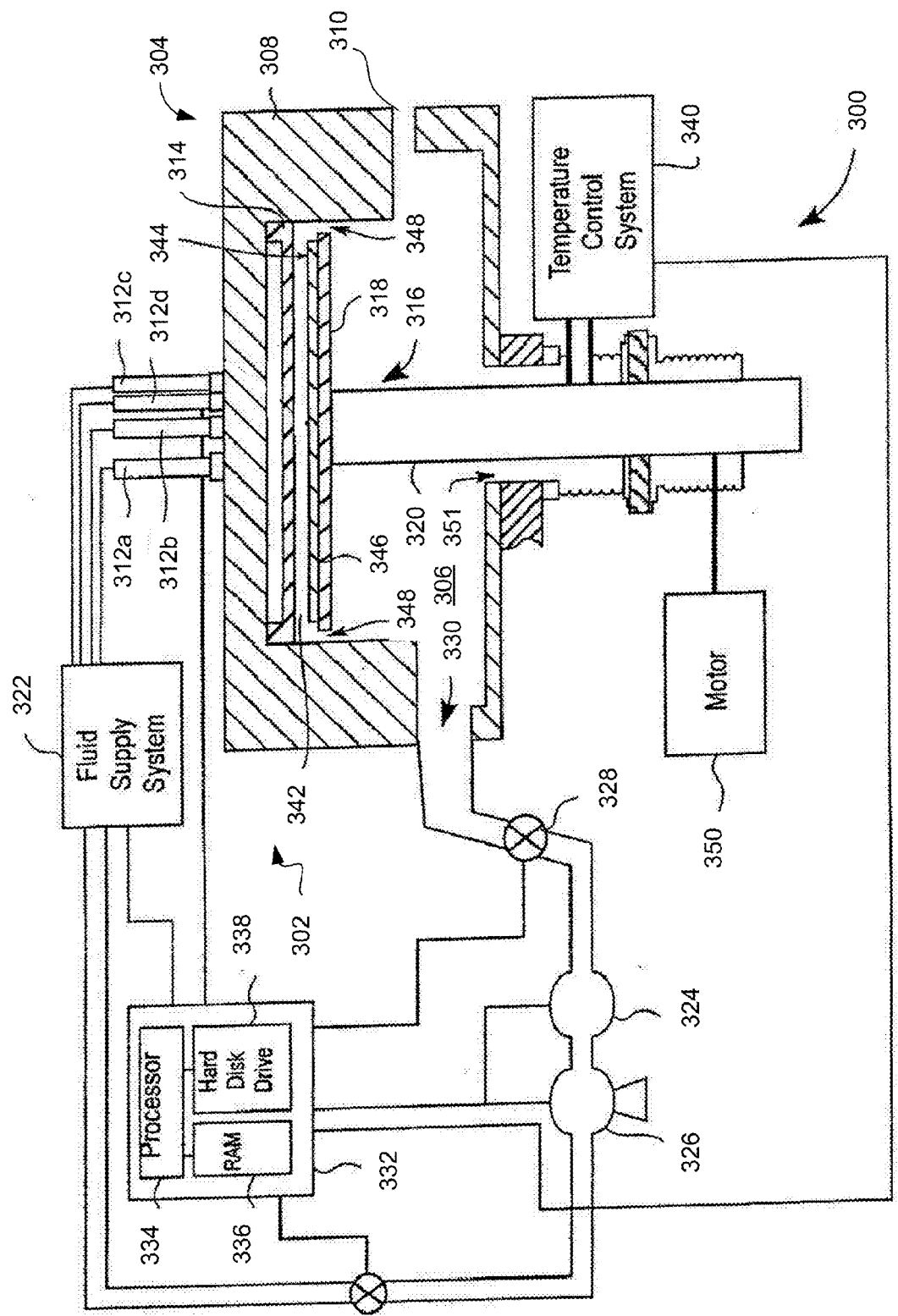
FIG. 3 illustrates an overview of certain components of the substrate processing system.
Figure 4:
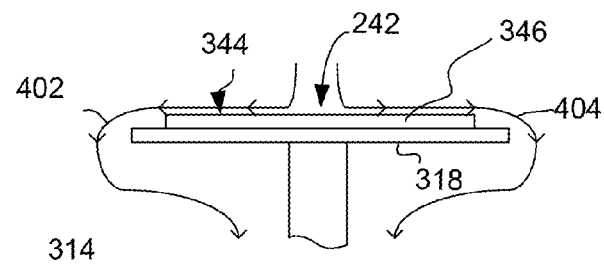
FIG. 4 illustrates gas flow over a substrate.
Figure 5A:
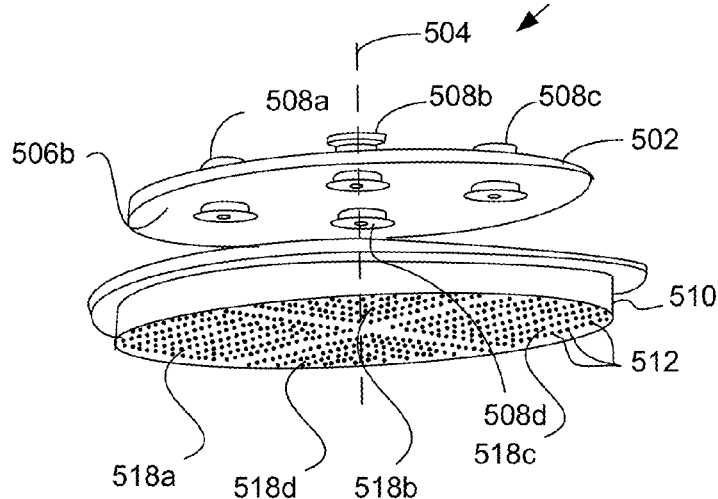
FIGS. 5A and 5B illustrate a segmented showerhead according to various embodiments.
Figure 5B:
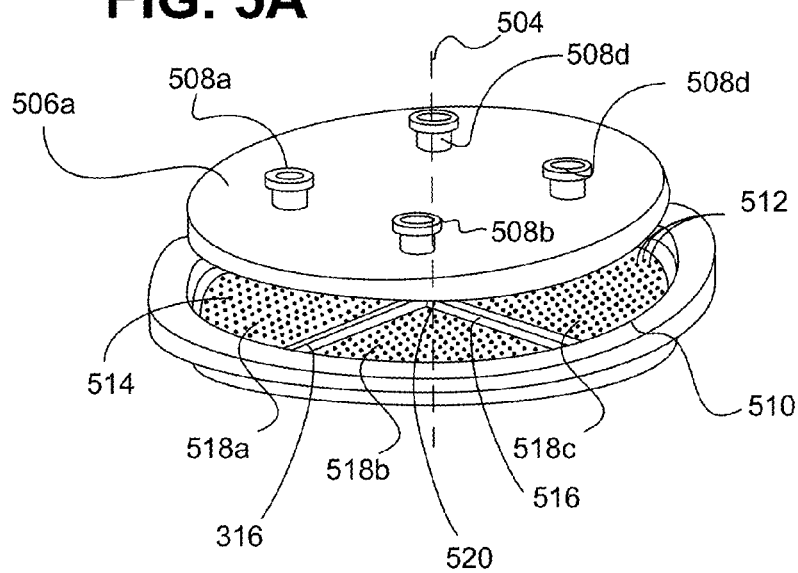

FIGS. 3, 4, 5A and 5B illustrate a substrate processing system 300 and components thereof in accordance with one embodiment of the present invention. FIG. 3 illustrates an overview of certain components of the substrate processing system 300. FIG. 4 illustrates gas flow over a substrate. FIGS. 5A and 5B illustrate a segmented showerhead according to various embodiments.

The substrate processing system 300 includes an enclosure assembly 302 formed from a process-compatible material, for example aluminum or anodized aluminum. Enclosure assembly 302 includes a housing 304 defining a processing chamber 306 and a vacuum lid assembly 308 covering an opening to processing chamber 306. A wafer transfer channel 310 is positioned in housing 304 to facilitate transfer of a substrate, discussed more fully below, between processing chamber 306 and an exterior thereto. Mounted to vacuum lid assembly 308 is a process fluid injection assembly that delivers reactive and carrier fluids into processing chamber 306, discussed more fully below. To that end, the fluid injection assembly includes a plurality of passageways 312a, 312b, 312c and 312d and a showerhead 314. The chamber housing 304, vacuum lid assembly 308, and showerhead 314 may be maintained within desired temperature ranges in a conventional manner.

A heater/lift assembly 316 is disposed within processing chamber 206. Heater/lift assembly 316 includes a support pedestal 318 connected to a support shaft 320. Support pedestal 318 is positioned between shaft 320 and vacuum lid assembly 308, when vacuum lid assembly 308 is in a closed position. Support pedestal 318, also known as a pedestal, may be formed from any process-compatible material, for example aluminum nitride and aluminum oxide ($Al_2O_3$ or alumina) and is configured to hold a substrate thereon, e.g., support pedestal 318 may be a vacuum chuck or utilize other conventional techniques such as an electrostatic chuck (ESC) or physical clamping mechanism. Heater/lift assembly 316 is adapted to be controllably moved so as to vary the distance between support pedestal 318 and the showerhead 314 to control the substrate to showerhead spacing. For example, the distance between the showerhead 314 and the pedestal 318 can be varied to enable or disable ignition of plasma across regions of a substrate. A sensor (not shown) provides information concerning the position of support pedestal 318 within processing chamber 306. Support pedestal 318 can be used to heat the substrate through the use of heating elements (not shown) such as resistive heating elements embedded in the pedestal assembly.

A fluid supply system 322 is in fluid communication with passageways 312a, 312b, 312c and 312d through a sequence of conduits. Flows of processing fluids, from fluid supply system 322, within processing chamber 306 are provided, in part, by a pressure control system that may include one or more pumps, such as turbo pump 324 and roughing pump 326 both of which are in fluid communication with processing chamber 306 via a butterfly valve 328 and pump channel 330. To that end, a controller 332 regulates the operations of the various components of system 300. Controller 332 includes a processor 334 in data communication with memory, such as random access memory 336 and a hard disk drive 338 and is in signal communication with turbo pump 324, temperature control system 340, fluid supply system 322 and various other aspects of the system as required. System 300 may establish conditions in a processing region 342 of processing chamber 306 located proximate to a surface 344 of a substrate 346 disposed on support pedestal 318 to form desired material thereon, such as a thin film. To that end, housing 304 is configured to create a peripheral flow channel 348 that surrounds support pedestal 318 when placed in a processing position to provide processing region 342 with the desired dimensions based upon chemical processes to be achieved by system 300. Pump channel 330 is situated in housing 304 so that processing region 342 is positioned between pump channel 330 and showerhead 314.

FIG. 4 illustrates flow over the substrate 346. Dimensions of peripheral flow channel 348 may be defined to provide a desired conductance of processing fluids therethrough which provide flows of processing fluids over a surface of substrate 346 in a substantially uniform manner and in an axisymmetric fashion as further described below. To this end, the conductance through pump channel 330 is chosen to be larger than the conductance through peripheral flow channel 348. In one embodiment, the relative conductance of processing fluids through pump channel 330 and peripheral flow channel 348 is, for example, 10:1, wherein the conductance of pump channel 330 is established to be at least ten (10) times greater than the conductance of processing fluids through peripheral flow channel 348. Such a large disparity in the conductance, which may be other ratios, serves to facilitate axisymmetric flow across the surface of substrate 346 as shown by flows 402 and 404 moving through processing region 342 and subsequently passing substrate 346 and support pedestal 318 toward pump channel 330.

Generally, to provide plasma to the substrate 346, a voltage difference can be created between the showerhead 314 and electrodes embedded in the pedestal 318 (see FIGS. 6A, 6B and 7A) while a plasma gas is supplied to the processing region 342. As is explained in the discussion of FIG. 6B, some regions of the substrate 346 can have a material deposited on the region using a plasma while others are deposited using another reagent (i.e. without plasma) while some regions of the substrate 346 may be etched on the region using a plasma while other regions are not etched or etched with other materials, other plasma gasses and the like. An electrode embedded in the pedestal 318 corresponding to the region to receive plasma and a conductive showerhead 314 can also be attached to a power source. In this way, a plasma flux may be directed to a region of the pedestal corresponding to a region of the substrate to deposit a material using plasma, and other regions can be processed using other reagents (e.g. oxygen or ozone) to combinatorially evaluate the properties of materials deposited with and without using plasma. Additionally, a plasma flux may be directed to a region of the substrate to contain an etch gas and etch a specific region of the substrate while other regions are not etched without plasma or are etched utilizing with or without plasma via other types of etch gases. This may allow efficient testing of various plasma parameters within regions of a substrate.

Referring to FIGS. 5A-5B, a multi-zone showerhead is shown, although a single-zone showerhead can be used according to embodiments of the invention. To facilitate the occurrence of flows A and B, showerhead 314 includes a baffle plate 502 that is formed to be radially symmetric about a central axis 504, but need not be. Baffle plate 502 has first and second opposed surfaces 506a and 506b, with a plurality of through ports 508a, 508b, 508c and 508d extending therebetween. Coupled to baffle plate 502 is a manifold portion 510 having a plurality of injection ports 512 extending through manifold portion 510. Manifold portion 510 is typically disposed to be radially symmetric about axis 504. Manifold portion 510 is spaced-apart from surface 506b to define a plenum chamber 514 therebetween. Manifold portion 510 may be coupled to baffle plate 512 using any means known in the semiconductor processing art, including fasteners, welding and the like. Baffle plate 512 and showerhead 314 may be formed from any known material suitable for the application, including stainless steel, aluminum, anodized aluminum, nickel, ceramics and the like.

In some embodiments, extending from manifold portion 510 is a fluid separation mechanism that includes a body 516 extending from manifold portion 510 toward baffle plate 502. The distance that body 516 extends from surface is dependent upon the specific design parameters and may extend to cover part of the distance or the entire distance to create segments within the plenum 514, as discussed more fully below. In one embodiment, body 516 may extend between the manifold 510 and baffle 502 in two orthogonal directions to create four regions, referred to as quadrants or segments 518a, 518b, 518c and 518d. Although four quadrants are shown, any number of segments may be provided by adding additional body portions 516 or modifying the port location and/or showerhead outlet pattern, depending upon the number of regions one wants to or can define on substrate 346. A vertex 520 of body 516 is generally aligned with axis 504. Passageways 312a-312d are configured to direct fluid through four ports shown as 508a-508d. In this manner, ports 508a-508d are arranged to create flows of processing fluids that are associated with a corresponding one of quadrants 518a-518d. Body 516 provides sufficient separation to minimize, if not prevent, fluids exiting ports 508a-508d from diffusing between adjacent quadrants 518a-518d. In this manner, each of the four ports 508a-508d directs a flow of processing fluids onto one of quadrants 518a-518d that differs from the quadrants 518a-518d into which the remaining ports 508a-508d direct flows of processing fluids.

In other embodiments, a standard showerhead 314 that does not include multiple zones can be used. In these embodiments, multiple regions of the substrate 348 can be differentiated or varied by the absence or presence of plasma using a pedestal 318 that includes multiple electrodes corresponding to multiple regions of the substrate (see FIGS. 6A, 6B, and 7A).

III. Combinatorial Plasma Processing System

A. Processing System Including Pedestal with Embedded Electrodes

Figure 6A:
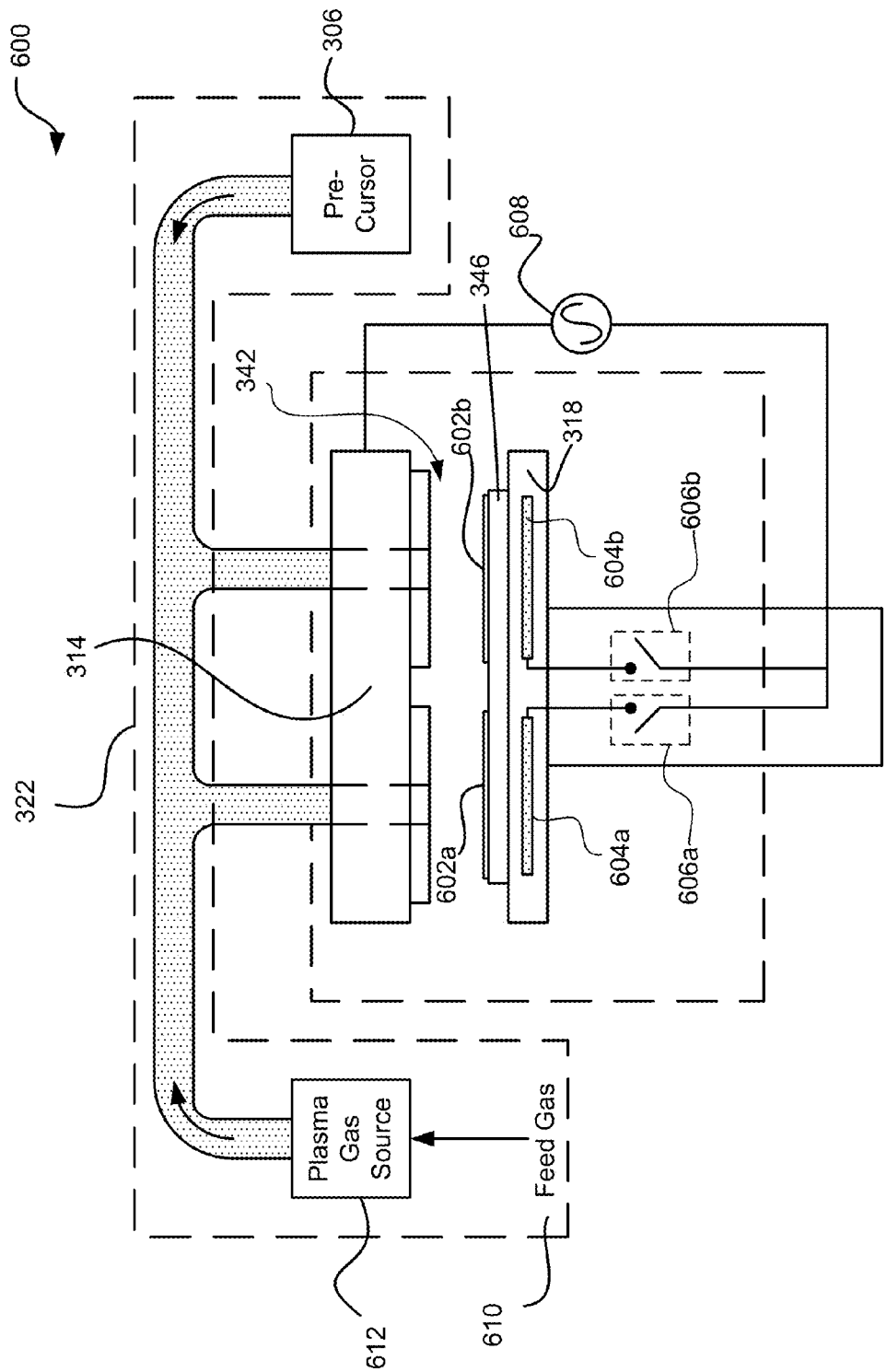
FIGS. 6A and 6B are simplified diagrams showing a substrate processing system.
Figure 6B:
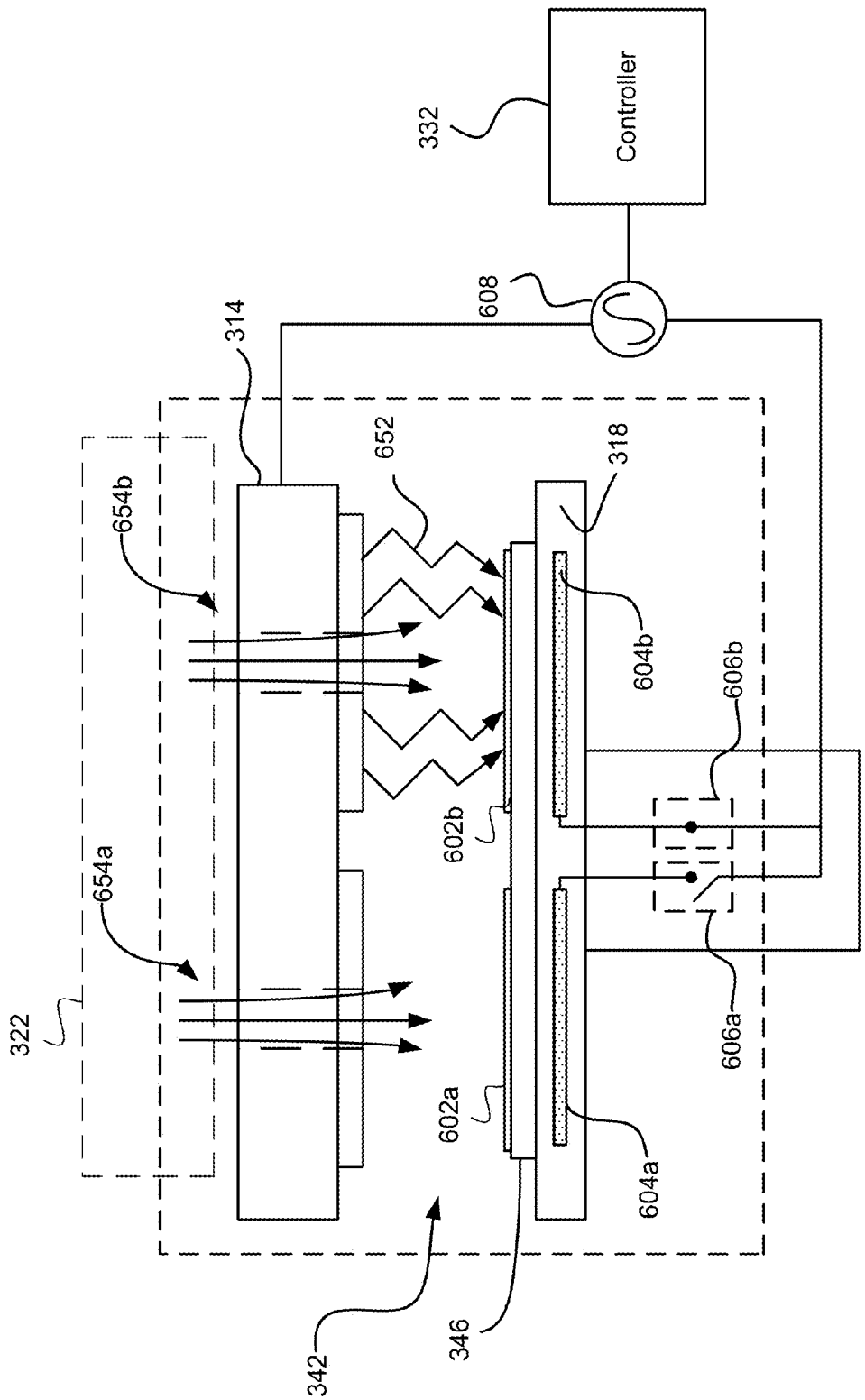

FIGS. 6A and 6B are simplified diagrams showing a substrate processing system 600 capable of depositing different materials under varying conditions using plasma-enhanced CVD (PECVD) or plasma-enhanced ALD (PEALD). Substrate processing system 600 may be configured to etch a substrate 346 utilizing different materials under varying conditions. FIG. 7A is an overhead view of pedestal 318. FIG. 7B illustrates the substrate 346 having multiple regions 702 with different materials 602 deposited thereon. The substrate processing system 600 may be a different view of the substrate processing system 300, in that the substrate processing system 600 may include features and elements of the substrate processing system 300.

Using the processing system 600, plasma can be selectively applied to regions 702 of the substrate 346 such that different materials (e.g., materials 602a-602d) are formed on different regions 702a-702d of the substrate 346. The materials 602a-602d can be considered different if they are formed using different processing parameters. For example, different precursors can be used in different regions, the same precursors can be used but with and without plasma in some regions, using different plasma gasses in the multiple regions, or some combination of parameters (e.g., RF power, duration, etc.). The regions 702 and the segments 518 of the showerhead 314 may have any size, shape, or configuration, but according to one embodiment, the regions 702 have a common size and shape. According to various embodiments, parameters or conditions of PECVD and PEALD that can be varied for combinatorial processing include power to ignite plasma, flow of plasma and other gasses, the type of plasma gas, pressure, selection of precursors, exposure time, spacing, etc. Additionally, the existence or absence of plasma in one or more regions 702 can be used as a combinatorial variable.

According to some embodiments, a non-segmented showerhead 314 can be used in a system 600 where materials 602 deposited in the regions 702 are varied by the absence or existence of plasma as a reagent. In other embodiments, when using a segmented showerhead 314, the segments of the showerhead 314 can have a similar shape to the electrodes 604 and to the regions 702, so that the segments, regions 702, and electrodes 604 all correspond.

Plasma can also be used to pre-treat or etch a substrate prior to an ALD or CVD process. Plasma can be used, for example, to remove contamination such as unwanted oxidation on the surface of a substrate. For example, if a copper substrate has surface oxides, the plasma can be applied to remove the unwanted oxides. Other plasma pre-treatments, such as to improve wettability of the substrate, can also be used. The plasma can be applied either to the entire substrate or combinatorially to some regions and not to others. Various parameters of the plasma (e.g., plasma gas composition) or the use of plasma versus not using plasma can be varied across regions of a substrate and evaluated in a combinatorial process. In some embodiments, combinatorial plasma pre-treatment and plasma etching can be used with subsequent non-combinatorial ALD or CVD processes (i.e., using the same processing conditions across the entire substrate).

It is further contemplated that plasma may be utilized for etching of a portion or entirety of a substrate. Additionally, the entire substrate 346 may have plasma applied to it, but using different materials or other processing conditions across different regions so that different materials are deposited. For example, each quadrant of the showerhead 314 can emit a different precursor. As used herein, a material (e.g., comprising a thin film or layer) is different from another material if the materials have different compositions, grain structures, morphologies, thicknesses, etc. In one embodiment, the fluid flow into the chamber 306 is approximately constant amount of flow across each region (e.g., 250 sccm). In some embodiments, the entire substrate 346 can be exposed to plasma, but different plasma gasses can be used to combinatorially vary the deposition or etch.

The processing system 600 includes a pedestal 318 including embedded electrodes 604 (also see FIG. 7A) that correspond to a region 702 of the substrate 346. For example, the electrode 604a corresponds to and is located in the pedestal 318 underneath the region 702a of the substrate 346. In addition, the electrode 604a and the region 702a can also correspond to a segment of the showerhead 318 (e.g. the segment 518a). The pedestal 318 is made from an insulating material such as a ceramic, with conductive electrodes 604 embedded inside, so that the electrodes 604 are electrically isolated from each other. The electrodes 604 are connected to switches 606, which are connected to a power supply 608. Power supply 608 is also connected to showerhead 314, which is made of a conductive material (e.g. a metal) and can be used as one of the conductive surfaces to form a plasma in the processing region 342.

B. Application of Plasma Using Processing System

Using plasma or other reagents during the second half of an ALD cycle or using plasma to enhance CVD processes can be a combinatorial variable according to various embodiments. Various techniques can be used to provide isolated plasma within the chamber 306. According to embodiments described herein, plasma can be provided to individual regions (and not to others) of the substrate 346 in situ.

In situ plasma can be provided by creating a voltage difference between two conductive surfaces that have a plasma gas (e.g. an ignitable gas) between the conductive surfaces. For example, a voltage difference can be created between one or more of the electrodes 604 and the showerhead 314, and a plasma gas can be provided by a plasma gas source 612 in the processing region 342. Paschen's Law states the conditions under which plasma is formed through a gas. According to Paschen's law, for a given gas between two conductive surfaces, a plasma is formed when a voltage difference greater than or equal to a breakdown voltage ($V_B$) is applied between the two conductive surfaces (e.g., the showerhead 314 and one of the electrodes 604). In this way a "circuit" is created using the showerhead 314 and one of the electrodes 604.

Plasma gasses that can be used include argon, oxygen, nitrogen, ammonia, etc. According to various embodiments, a plasma gas can be introduced into the processing region 342, and can be ignited in one region (e.g. 602a) and not in another region (e.g. 602b) by creating a voltage difference in one region of the substrate 342 and not in the other. As a result, different materials having different properties can be formed in the multiple regions 602 of the substrate 346 in a combinatorial manner by varying the plasma. For example, plasma can be used as a reagent in one region 602a of substrate 346 while another reagent is used in a second region 602b of the substrate 346.

C. Generating Plasma Using Embedded Electrodes

Switches 606 can be controlled by the controller 332, for example. Controller 332 can open or close the switches 606 to activate plasma in certain regions 702. For example, as shown in FIG. 6B, controller 332 has closed the switch 606b so that the circuit through the electrode 604b is completed. When a plasma gas 610 from a plasma gas source 612 is introduced into the processing region 342, the circuit is completed and plasma 652 is created in the processing region 342 between the showerhead 314 and the substrate 348. Plasma 652 may be used as a reagent for forming the material 602b on the region 702b.

The material 602a in the region 702a, however, is formed without plasma as a reagent, since the switch 606a is open, which prevents a current path from being formed through the region 702a. As a result, the material 602a can be formed using another reagent (e.g. oxygen, ozone, etc.) using the gas flow 654a.

As is shown in FIG. 7A, the electrodes 604 are embedded in the pedestal 318 and have shapes that correspond approximately to the regions 702. The electrodes 604 will, when activated by closing the corresponding switches 606, draw plasma flux into the regions 702 of the substrate 346 to which they correspond. It is contemplated that controller 332 may activate plasma in certain regions 702 via grounding of one or more electrodes without employing switches 606. Shape of the electrodes 604 can be selected to create a flux pattern at the surface of the substrate 346 that is adequate for the deposition of materials using the specific processing system 600. In other embodiments, electrodes 604 can have other shapes, such as circular or elliptical. As is shown in FIG. 7A, electrodes 604 are connected to ground 710. In some embodiments, the electrodes 604 can be connected to ground 710, and the showerhead 314 can be connected to a power source. In other embodiments, the electrodes 604 can be connected to the power source, and the showerhead 314 can be connected to ground 710. In yet further embodiments, both the electrodes 604 and the showerhead 314 can be connected to power sources having different phases.

As is shown in FIG. 7B, different materials 602 can be deposited on each of the regions 702 by varying the processing conditions used to make each of the materials 602. For example, in some embodiments, one precursor can be flowed over the entire substrate 342, while plasma is applied in two regions (e.g. 702a and 702b) and another oxidizing reagent (e.g. ozone) is applied in the other two regions (e.g. 702c and 702d). This can be accomplished by closing the switches 606a and 606b and leaving the switches 606c and 606d open.

A voltage difference between the showerhead 314 and the electrodes 604 can be provided in several ways. According to one embodiment, a power source 608 is attached to one or both of the showerhead 314 and the electrodes 604. Power source 608 may be a power supply. Power source 608 may be a radiofrequency (RF) power source. RF power source can use any frequency including 2 megahertz (MHz), 3.39 MHz, 13.56 MHz, 60 MHz, 300-500 kilohertz (kHz) and other frequencies. In one embodiment, the electrodes 604 can be connected to ground and the showerhead 314 can be connected to the RF power source. In another embodiment, the electrodes 604 can be connected to the RF power source, and the showerhead 314 can be connected to ground. In further embodiments, both the electrodes 604 and the showerhead 314 are connected to RF power sources, which can be offset in either or both of frequency or phase. Any of these embodiments can provide the voltage differences between the showerhead 314 and the electrodes 604 to ignite or not ignite plasma in the chamber 306 as desired. Other types of power sources, such as direct current (DC) power sources, can also be used to generate the voltage difference. According to one embodiment, to avoid damage to preformed devices on a substrate, the power supplied is less than 1.0 W/cm$^2$. However, it is understood that any amount of power can be used.

When a precursor or a gas is introduced by gas injection system 322, the chemical reagents interact on the substrate 346 to form the materials 602. The substrate 346 has different materials 602 deposited on four different regions 702. As described above, materials can be considered different if they vary in any substantive way, such as in composition (i.e., chemical constituents), morphology, thickness, etc. For example, each of the materials 602 could be deposited using different precursors. The material 602a could be tantalum (formed using a tantalum precursor such as tris(diethylamino)(tert-butylimido) tantalum (TBTDET)), the material 602b could be titanium (formed using a titanium precursor such as tetrakis diethylamido titanium (TDEAT)), the material 602c could be hafnium (formed using a hafnium precursor such as tetrakis(dimethylamido) hafnium (TDMAHf)), and the material 602d could be ruthenium (formed using a ruthenium precursor such as bis(methylcyclopentadienyl) ruthenium (Ru(MeCp)$_2$)). In this manner, four different materials are combinatorially deposited using four different precursors. Alternatively, processing sequences or other processing conditions can be varied by region or across regions to create a combinatorial array. The specific variation is generally defined in the design of experiment, but need not be so defined. In some embodiments, the same materials can be formed in multiple regions (e.g. the same material can be formed in regions 702a and 702c) to provide multiple samples of the same materials and/or processes.

IV. Process for Performing Combinatorial Evaluation

Figure 8:
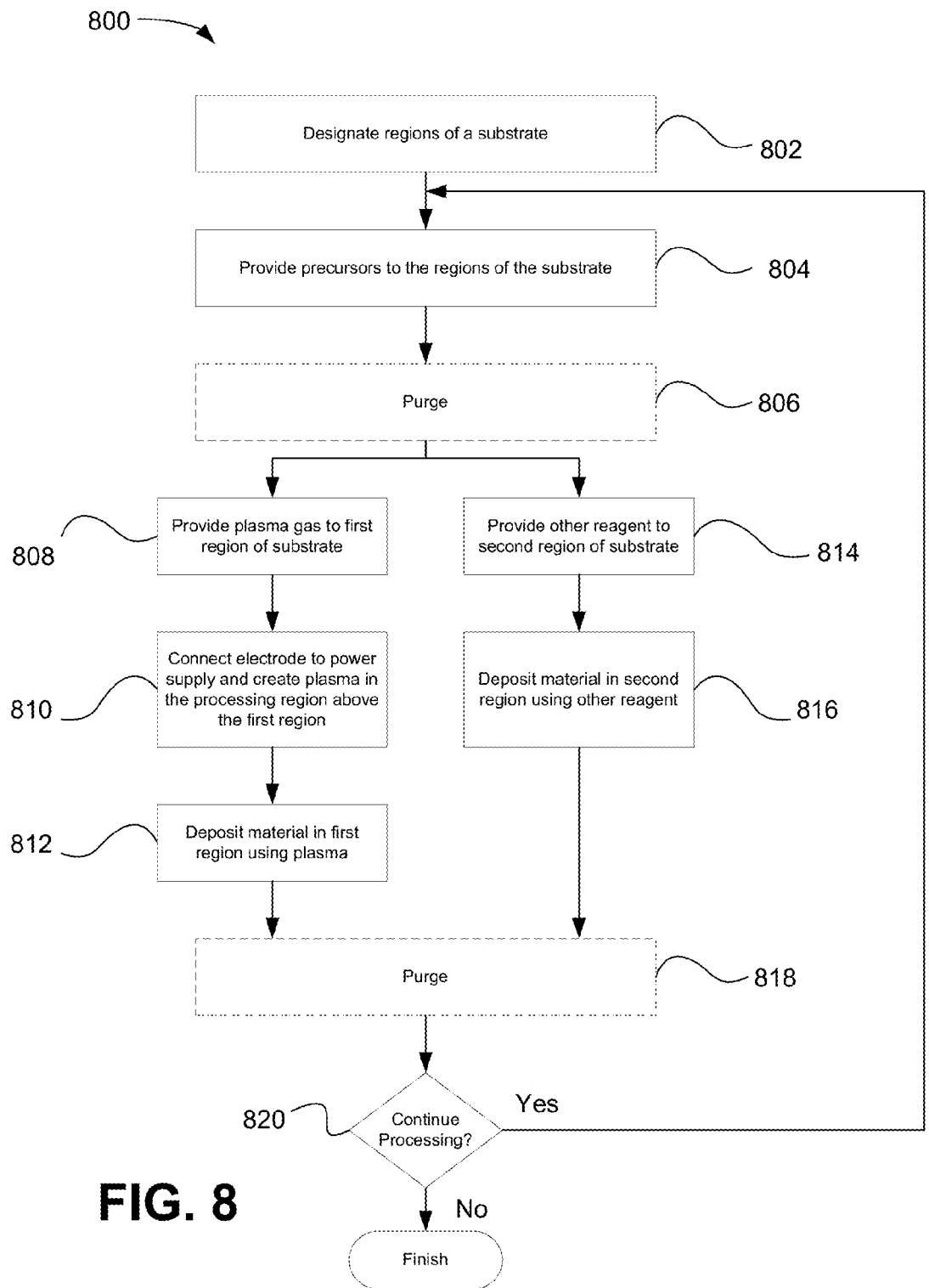
FIG. 8 is a flowchart describing a process for varying plasma across multiple regions of a substrate to process the substrate combinatorially.

FIG. 8 is a flowchart describing a process 800 for varying plasma across multiple regions of a substrate to process the substrate combinatorially. The process 800 can be employed for etch, CVD or ALD processes.

In operation 802, multiple regions of a substrate are designated. For example, some regions of the substrate can be designated to receive plasma as a reagent for processing, while others use another, non-plasma reagent. In operation 804, precursors are provided to regions of the substrate. In some embodiments, a first region and a second region can receive different precursors, while in other embodiments; a first region and a second region receive the same precursor. In these embodiments, plasma or the absence of plasma as a reagent can be used as a combinatorial variable. In operation 806, the substrate is optionally purged. For example, in an ALD process, the substrate can be purged to remove excess precursor.

Operations 808-812 describe operations occurring in regions (e.g. a first region) that use plasma as a reagent to deposit a material, while operations 814 and 816 describe operations occurring in regions (e.g. a second region) that use reagents other than plasma to deposit a material.

In operation 808, a plasma gas, such as argon, is provided to the first region of the substrate. The plasma gas can be a gas that meets the conditions of Paschen's law for the distance between the electrode 604 and the showerhead and the pressure in the chamber. In operation 810, an electrode 604 in a pedestal 318 holding the substrate 346 and corresponding to the first region 702 is connected to a power supply. For example, the controller 332 can cause a switch 606 to close, creating a "circuit" in the first region. Connecting the electrode creates plasma in the first region to deposit a material using the plasma in the first region in operation 812.

To deposit a material using a non-plasma reagent in the second region, in operation 814, the other reagent (e.g. oxygen, ozone, water vapor, etc.) is provided to the second region. In operation 816, the other reagent combines with the precursor and the material is deposited in the second region.

In operation 818, the substrate 346 is again optionally purged, and in operation 820, it is determined whether additional processing is needed. For example, in order to create a layer having increased thickness, additional ALD cycles can be performed, or additional time for CVD processes can be given. In order to remove a material, additional time for etch processes can be given.

After the materials are combinatorially deposited in each of the regions, further operations can be performed. For example, the materials can be characterized using processes such as electrical testing or imaging. Materials can further be selected for additional processing, for example by advancing certain materials, unit processes and/or process sequences to further stages or full-substrate (e.g. full-wafer) processing.

V. Plasma Enhanced Processing Examples

Figure 9:
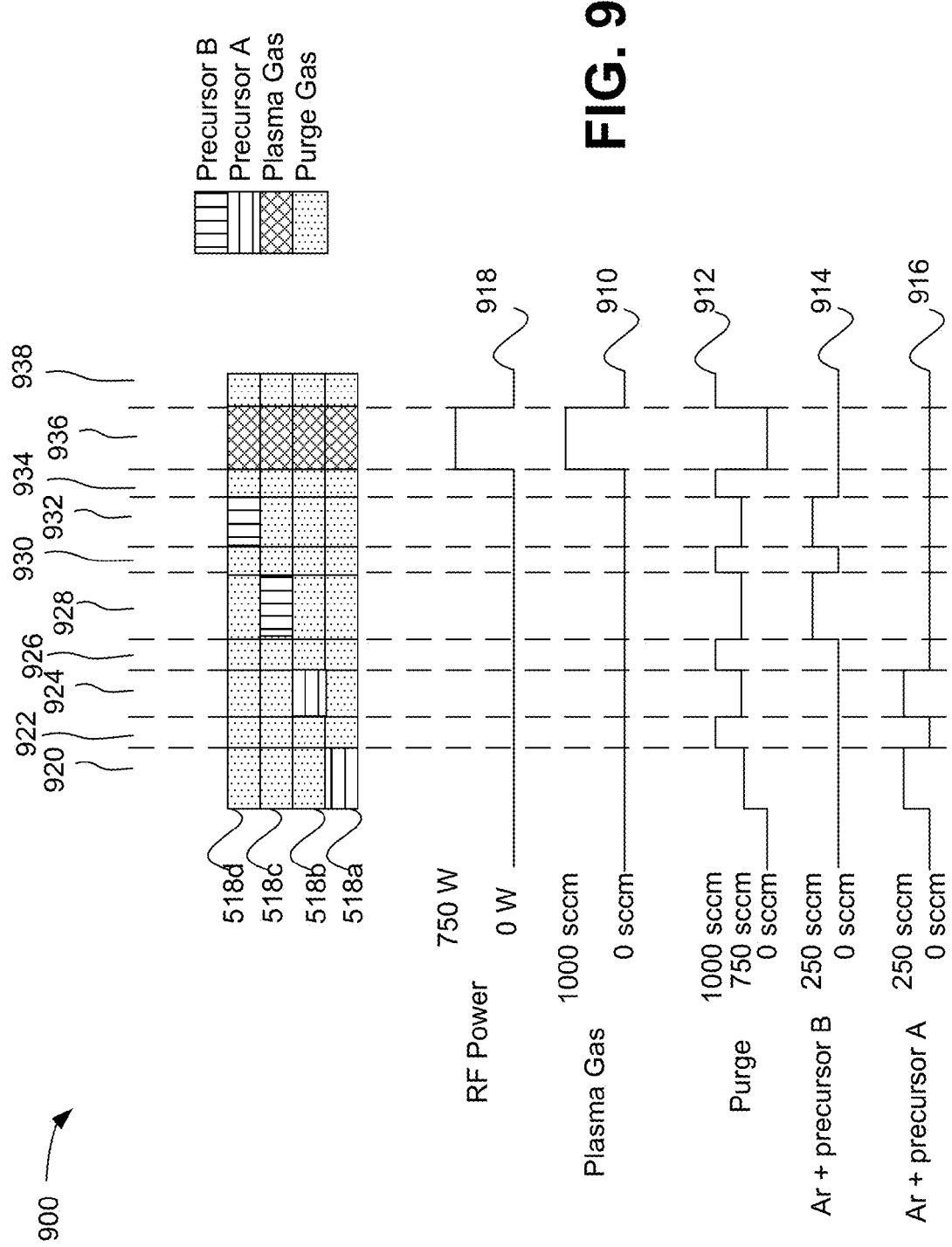
FIGS. 9-12 are timing diagrams for performing combinatorial plasma enhanced processing.
Figure 10:
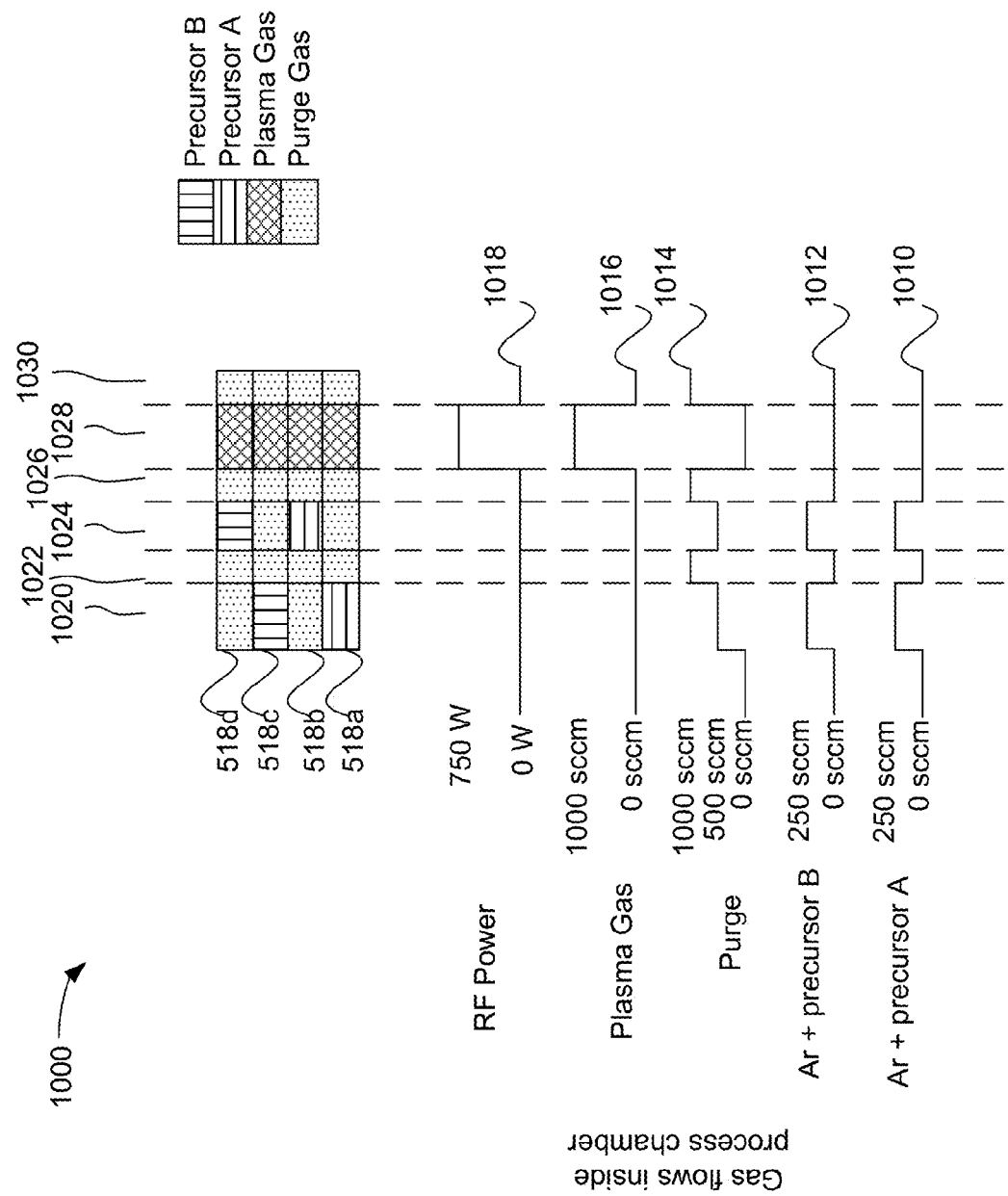
Figure 11:
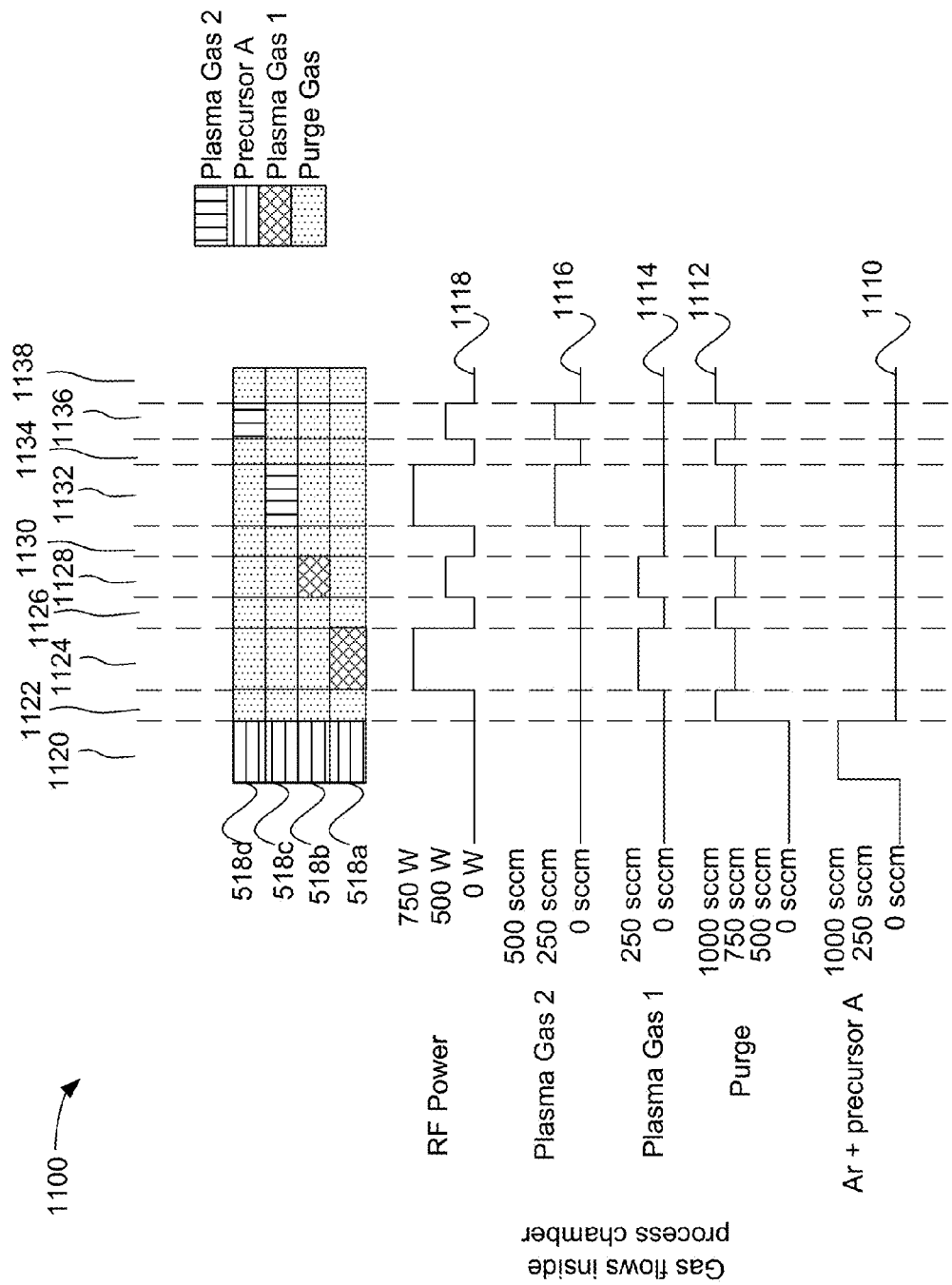
Figure 12:
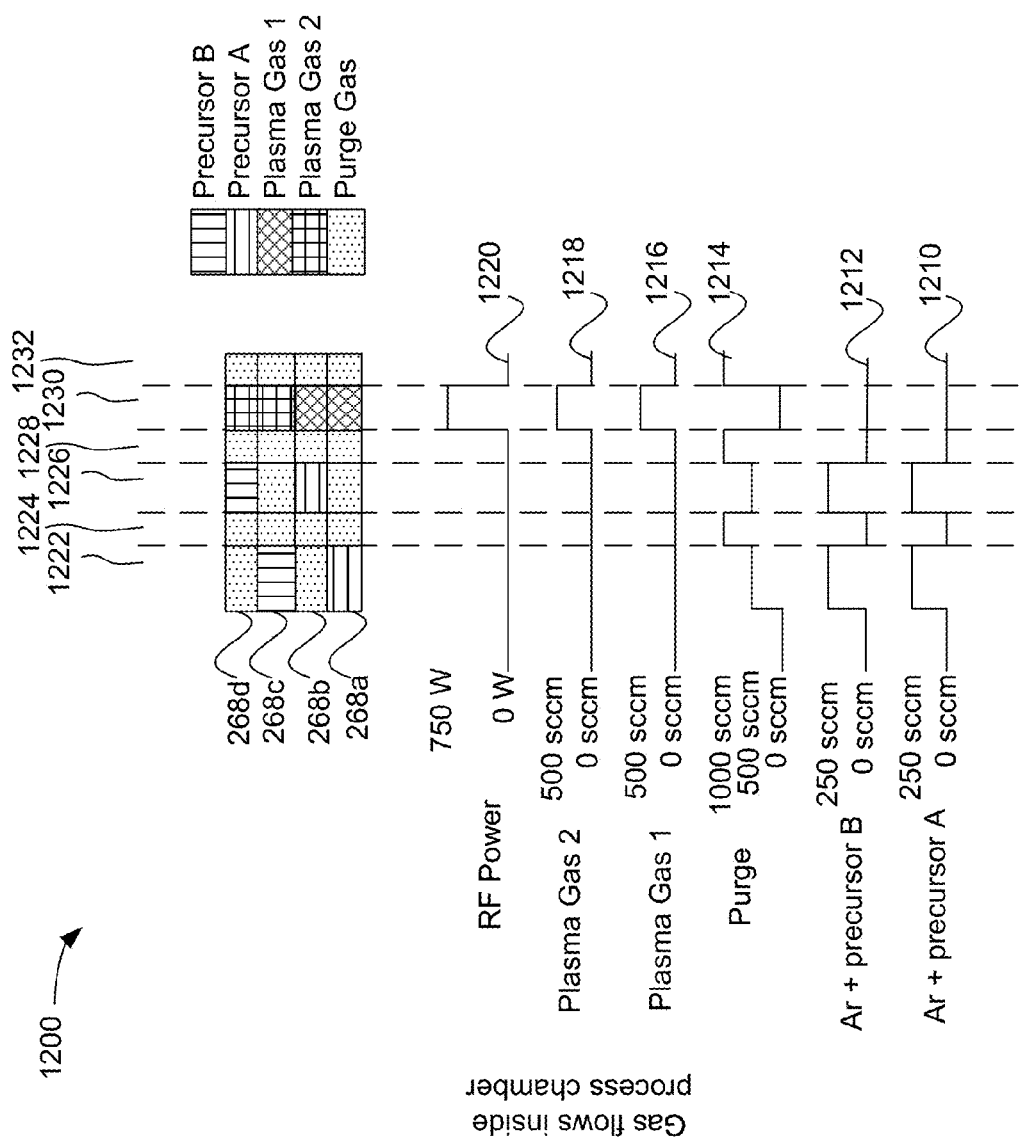

FIGS. 9-12 are timing diagrams for performing combinatorial plasma enhanced processing. The timing diagrams describe several scenarios for forming multiple materials on a substrate using combinatorial PEALD. FIG. 9 shows a scenario where two different precursors are applied sequentially and plasma is applied across the substrate. FIG. 10 shows a scenario where two different precursors are applied simultaneously and plasma is applied across the substrate. FIG. 11 shows a scenario where a single precursor is used across the substrate and the plasma is varied between regions of the substrate. FIG. 12 shows a scenario where two different precursors are provided and plasma is varied across regions of the substrate. Other variations are possible and these examples are merely representative of the possible types of experimentation and not meant to be limiting in the possible applications of this invention. The cycles shown in FIGS. 9-12 can be repeated to deposit multiple layers.

1. Varying Precursors and Using a Common Plasma

As shown in FIG. 9, the flow into four segments of a showerhead is explained using the flow diagram 900. The flow through the four segments 518a, 518b, 518c, and 518d of the showerhead 314 is shown in the flow diagram 900. As described above, each segment 518 may correspond to a region 702 of a substrate 346 to deposit a material 302 thereon. The total flow through the showerhead 314 is approximately constant. For example, as shown here, the total flow through the showerhead is always approximately 1000 standard cubic centimeters per minute (sccm) (250 sccm for each segment), although any appropriate flow may be used. Additionally, although the flow is equal for each segment 518, in embodiments where segments 518 have different sizes or different configurations, different amounts of flow may be used for each segment 518.

The flow diagram 900 shows the flow of plasma gas 910, purge gas (e.g., nitrogen gas) 912, a first precursor A 916, and a second precursor B 914. The plasma gas can be selected according to Paschen's law (above) so that plasma is ignited when desired. The RF power 918 is used to ignite the plasma.

The precursor B 914 and precursor A 916 are typically small amounts of precursor chemical in a carrier gas. For example, the precursor chemical may be flowed at 1 sccm equivalent, while Argon carrier gas is flowed at 249 sccm.

The timing diagram is divided into several varying periods of time 920-938. During each period of time 920-938, a total of approximately 1000 sccm is flowed over the substrate 346. The 1000 sccm can comprise any combination of plasma gas 910, purge gas 912, precursor B and carrier gas 914 and precursor A and carrier gas 916. In this example, each segment 518 and region 702 receives approximately 250 sccm of flow. When the precursor is delivered to a region 702, each other region 702 is exposed to purge gas. So, at time 920, 250 sccm of precursor A and carrier gas is provided using segment 518a, while 750 sccm of purge gas is provided using segments 518b, 518c, and 518d.

Generally, as described above ALD can be considered a self-limiting process that uses two reagents. In this description, the first reagent is a precursor (e.g., precursor A or B, such as a hafnium precursor or aluminum precursor) and the second reagent is a reactant such as water vapor, ozone, or plasma (e.g., oxygen plasma). A typical ALD cycle may include flowing the precursor, purging to remove excess precursor, reacting the second reagent with the precursor to deposit a monolayer, and a subsequent purging to remove excess reagent. Additional monolayers can be deposited by repeating the cycle. In some embodiments, a submonolayer or more than a monolayer are deposited in a cycle.

As shown here, the precursor A is provided using segment 518a and segment 518b at times 920 and 924, respectively. Times 920 and 928 are longer than times 924 and 932, therefore more of precursor A and precursor B is provided during times 920 and 928 than during times 924 and 932. The length of time that the precursor is flowed over the substrate can be a combinatorial variable used to determine, for example, the amount of time needed to form a saturated adsorbed layer on the substrate. Times 920-934 describe the first half of the ALD cycle (providing the precursor and purging) for each of the segments 518.

The second half of the ALD cycle is completed by igniting plasma at time 936. The plasma is struck by providing a voltage difference between the pedestal 318 and the showerhead 314. In this embodiment, a common plasma gas is flowed across all regions of the substrate, and plasma is struck in all regions. The ALD deposition process is completed at time 938 when the remaining gasses are purged. The cycle can be repeated to deposit multiple layers.

After forming the four different materials 602 in the four regions 702, each of the different materials 602 can be characterized (e.g., using electrical testing and/or imaging) and evaluated for subsequent processing.

FIG. 10 is a timing diagram 1000 describing an ALD cycle in which two different precursors are delivered to two different regions of a substrate simultaneously. As with the timing diagram 900, the timing diagram 1000 shows the flow to segments 518a-d. The flow of a first precursor A and carrier gas 1010, the flow of a second precursor B and carrier gas 1012, the flow of purge gas 1014, the flow of plasma gas 1016, and the amount of RF power 1018 are shown in line graphs. The gas flowed into each of the segments 518a-d and the amount of flow or power 1010-1018 is shown for times 1020-1030.

As can be seen in the timing diagram 1000, at time 1020, precursor A and carrier gas is flowed through segment 518a and precursor B and carrier gas is flowed through segment 518c, while segments 518b and 518d flow purge gas. At time 1022, the entire substrate 346 is purged to remove excess precursor. At time 1024, precursor A and carrier gas is flowed through segment 518b and precursor B and carrier gas is flowed through segment 518d, while segments 518a and 518c flow purge gas. Again, at time 1026, the entire substrate 346 is purged to remove excess precursor. Times 1020-1026 are the first half of an ALD cycle. Time 1020 is longer than time 1024, and this exposure time is a parameter than can be varied combinatorially.

At time 1028, plasma gas is flowed through all segments 518a-d, and plasma is struck by creating a voltage difference by applying RF power 1018 between the showerhead 314 and the electrodes 604. Striking the plasma completes the ALD cycle and a monolayer is formed in each of the regions of the substrate 346. The substrate 346 is purged again at time 1030. In some embodiments, the layer deposited may be a submonolayer or greater than a monolayer. The cycle can be repeated to deposit multiple layers.

2. Varying Plasma Across Regions

FIG. 11 is a timing diagram 1100 for varying plasma across regions when performing combinatorial PEALD. Segments 518a-d correspond to regions 702a-d on the substrate 346 that are combinatorially processed. This example uses a single precursor and multiple plasma gasses and exposure times to evaluate the effects of those parameters on depositing materials.

A graph 1110 shows the flow of precursor plus carrier gas. A graph 1112 shows the flow of purge gas. A graph 1114 shows the flow of a first plasma gas 1 and a graph 1116 show the flow of a second plasma gas 2. The graph 1118 shows the amount of RF power being used.

In this example, each of segments 518a-d receives 250 sccm of precursor A plus carrier gas at time 1120. As shown in graph 1110, precursor A plus carrier gas is flowed at 1000 sccm (i.e., 250 sccm for each of segments 518a-d). At time 1122, purge gas is flowed across the substrate to remove excess precursor. Times 1120 and 1122 describe the first half of an ALD cycle. Times 1124-1138 describe the second half of the ALD cycle.

The ALD cycle used here combinatorially varies plasma gas and the exposure time. For example, segments 518a and 518b flow plasma gas 1 at times 1124 and 1128, respectively. Time 1124 is longer than time 1128, and more power (i.e., 750 W vs. 500 W) is used to strike the plasma during time 1124. In some embodiments, plasma gas 1 may be chosen such that conditions are not sufficient to strike plasma in segment 518b (e.g., not enough power or too much distance/separation). Optionally, another second reagent can be used to complete the formation of the ALD layer.

Regions corresponding to segments 518c and 518d are exposed to plasma gas 2 at times 1132 and 1136, respectively. Time 1132 is longer than time 1136 and more power (i.e., 750 W vs. 500 W) is used to strike the plasma at time 1132 than at time 1136.

In these embodiments, the effects of two different plasma gasses, different power levels, and different exposure times can be evaluated so that an optimum solution can be derived. The deposited layer may, in various embodiments, be a monolayer, submonolayer, or greater than a monolayer.

FIG. 12 is a timing diagram 1200 describing an embodiment where two different precursors are delivered simultaneously and two different plasma gasses are delivered simultaneously. As with the other timing diagrams, timing diagram 1200 shows the delivery of gasses through segments 518a-d at times 1222-1232. The power or flow of each gas or power source is shown in graphs 1210-1220.

At time 1222, a first precursor A is delivered to segment 518a and a second precursor B is delivered to segment 518c.

At time 1224, the substrate 346 is purged to remove excess precursor. At time 1226, precursor A is delivered to segment 518b and precursor B is delivered through segment 518d. At time 1228, the substrate 346 is again purged to remove excess precursor. Time 1222 is longer than time 1226, therefore the exposure time of the precursors to the substrate is varied combinatorially. Times 1222-1228 are the first half of an ALD cycle.

Times 1230 and 1232 are the second half of the ALD cycle. The second reagent is again the plasma, which is delivered at time 1230. Two plasma gasses are simultaneously delivered to the substrate: plasma gas 1 to segments 518a and 518b, and plasma gas 2 to segments 518c and 518d. Full RF power 1220 is provided at time 1230 to ignite the plasma throughout the substrate. In some embodiments, the plasma gas 1 may be a gas that is easy to ignite (e.g., Ar), while plasma gas 2 is a gas that is difficult to ignite (e.g., $H_2$), so that plasma is provided in the regions corresponding to the segments 518a and 518b and not in the regions corresponding to segments 518c and 518d. The deposited layer may, in various embodiments, be a monolayer, submonolayer, or greater than a monolayer.

3. Other Examples

The four timing diagrams 900, 1000, 1100, and 1200 are examples of combinatorially varied PEALD. Various other processes can be developed and used according to embodiments of the invention. For example, in some embodiments, plasma can be used in the ALD cycle to deposit a material in one or more regions of a substrate, while another reagent (e.g., water vapor) is used to form an ALD deposited material in other regions. In this way, the differences between conventional ALD and PEALD can be explored using a single experiment. Also according to other embodiments, more than two different precursors could be used, and other variables could be explored.

PECVD uses plasma as an enhancement to improve reaction rates and to reduce processing temperatures. Plasma can also be used with CVD to vary the film properties, e.g., density, composition, step coverage, adhesion, dielectric constant, film leakage, breakdown voltage, etc. Various different scenarios can be used to perform combinatorial processing using PECVD. As with combinatorial PEALD, precursors can be varied across regions while plasma is applied to all regions of the substrate. According to another example, plasma can be provided in one or more regions, while not provided in others. In this one example, the same precursor can be provided to all regions, or the precursor or other parameters of the PECVD can be varied.

Unlike ALD, CVD is not self-limiting, and CVD films continue to grow the longer a substrate is exposed to the CVD precursors and plasma. For some CVD processes, one or more precursors and plasma can be provided simultaneously for a desired amount of time to grow a layer of a desired thickness. As a result, for combinatorial PECVD, several parameters for CVD can be varied to determine an optimum solution such as precursor exposure time, precursor mixture, plasma gas composition and voltages.

For example, two regions can be exposed to the same precursor for different amounts of time to study the growth rate of the precursors. Alternatively, two regions could be exposed to the same precursor, one region with plasma and the other without for the same amount of time to study the change in growth rate when using plasma. As with PEALD, different plasma gasses and other plasma variables can be compared for PECVD to determine an optimum plasma solution.

Figure 13A:
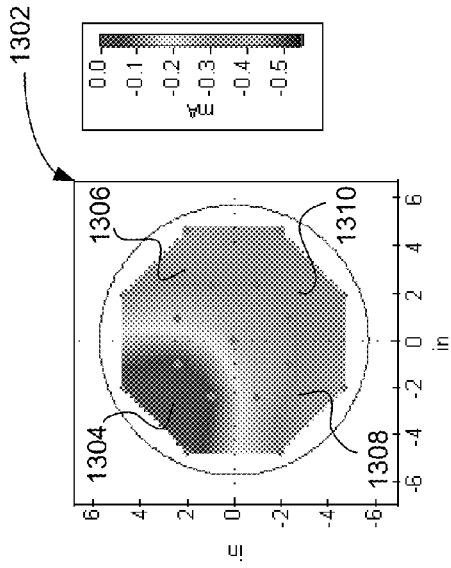
FIGS. 13A, 13B, 14A and 14B show the existence of different plasma species in different regions of a substrate.
Figure 13B:
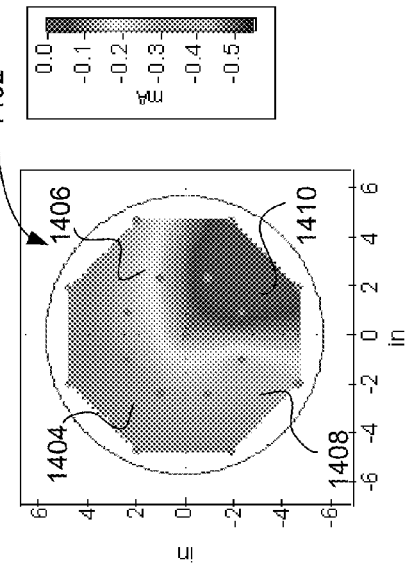
Figure 14A:
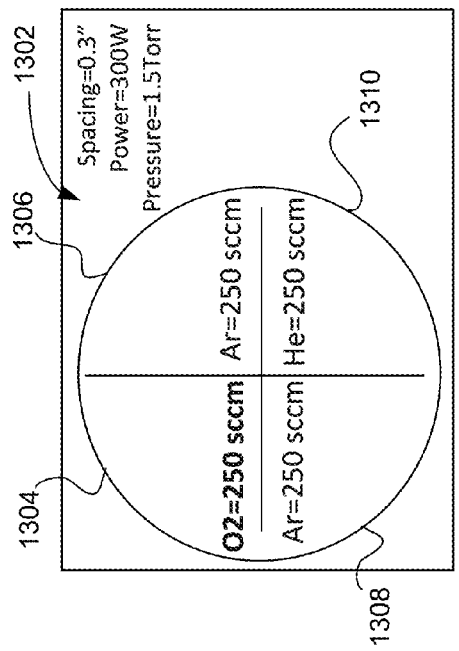
Figure 14B:
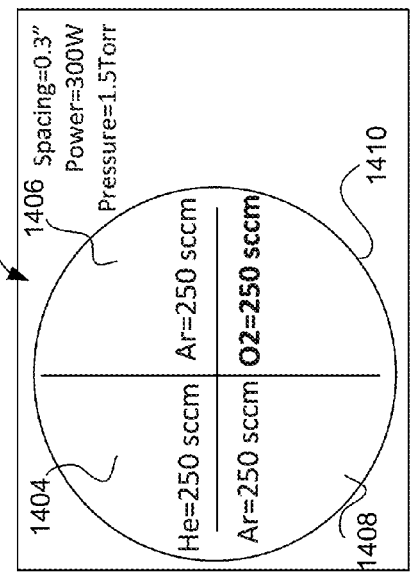

FIGS. 13A, 13B, 14A and 14B show the existence of different plasma species in different regions of a substrate when using plasma over a whole substrate but exposing different regions to different plasma gasses. FIGS. 13A-14B show experimental results using a showerhead having four quadrants. FIGS. 13A and 14A show which plasma gasses are flowed into which regions of the substrate, and FIGS. 13B and 14B illustrate the existence of different plasma species in the regions of a substrate.

The images in FIGS. 13B and 14B represent the currents in the regions that are created using the specifications shown in FIGS. 13A and 14A, respectively. In FIGS. 13A and 13B, a substrate 1302 has four regions 1304, 1306, 1308, and 1310. The showerhead-substrate spacing is 0.3" (0.75 cm), the power provided by the power supply is 300 W, and the pressure in the chamber is 1.5 Torr. Oxygen ($O_2$) is the plasma gas flowed into the region 1304, Argon is the plasma gas flowed into the regions 1306 and 1308, and Helium is the plasma gas flowed into the region 1310. Each gas is flowed at 250 sccm, so the parameter changed across each region in this example is the plasma gas.

FIG. 13B illustrates the amount of current present in each region 1304-1310. Different plasma gasses can have different current characteristics; for example, He and Ar have similar current characteristics, while the Ion currents for $O_2$ plasma are low. As is shown in FIG. 13B, very little ion current (near zero) exists in the region 1304, which conforms to the expected behavior of oxygen plasma, while relatively higher ion current exists throughout the regions 1306, 1308, and 1310, which conforms to the expected behavior of He and Ar plasmas. This confirms the existence of different plasma gasses throughout the substrate 1302.

Similarly, in FIG. 14A, He plasma gas was flowed into the region 1404 of the substrate 1402, Ar gas was flowed into the regions 1406 and 1408, and $O_2$ was flowed into the region 1410. As FIG. 14B shows, the region 1410 receives almost no ion current, while the regions 1404, 1406, and 1408 receive more ion current, again confirming that it is possible to create plasma in different regions of substrate 1402.

Although the foregoing examples have been described in some detail for purposes of clarity of understanding, the disclosure is not limited to the details provided. There are many alternative ways of implementing the disclosure. The disclosed examples are illustrative and not restrictive.

What is claimed:

1. A method comprising:
    designating a first region and a second region on a surface of a substrate, wherein the substrate is disposed on a pedestal, wherein the first region corresponds to a first electrode embedded in the pedestal and the second region corresponds to a second electrode embedded in the pedestal;
    providing plasma gas to a first processing region above the first region of the substrate;
    connecting the first electrode to a power source; and
    creating a plasma in the first processing region and isolating the plasma from a second processing region above the second region of the substrate.

2. The method of claim 1, further comprising:
    depositing a first material above the first region of the substrate using the plasma; and
    depositing a second material above the second region of the substrate using a non-plasma reagent.

3. The method of claim 1, further comprising:
    etching a first material above the first region of the substrate using the plasma.

4. The method of claim 1, further comprising providing a first precursor to the first region of the substrate and a second precursor to the second region of the substrate.

5. The method of claim 4, wherein providing the first precursor and the second precursor comprises providing the first precursor and the second precursor using a showerhead having multiple segments.

6. The method of claim 1, further comprising providing a showerhead above the pedestal, wherein the showerhead is connected to a plasma gas source and the showerhead is configured to deliver plasma gas to the first processing region.

7. The method of claim 6, wherein the creating the plasma in the first processing region comprises creating a voltage difference between the showerhead and the first electrode with the power source.

8. The method of claim 7, further comprising:
disconnecting the first electrode from the power source;
connecting the second electrode to the power source; and
creating a plasma in the second processing region and isolating the plasma from the first processing region, wherein the creating the plasma in the second processing comprises creating a voltage difference between the showerhead and the second electrode with the power source.

9. The method of claim 2, wherein the depositing the second material above the second region of the substrate using the non-plasma reagent comprises providing a non-plasma reagent to the second processing region while the plasma gas is provided to the first processing region.

10. The method of claim 9, further comprising characterizing the first material and the second material.

11. A method comprising:
providing a substrate disposed on a pedestal, wherein the pedestal comprises at least two electrodes embedded therein;
providing a showerhead above the pedestal;
delivering plasma gas to a processing region between the showerhead and the pedestal; and
creating a voltage difference between the showerhead and one of the at least two electrodes to create a plasma after the delivering of the plasma gas into the processing region, wherein the plasma is substantially contained in a first area of the substrate which corresponds with the one electrode of the at least two electrodes.

12. The method of claim 11, wherein the plasma is substantially isolated from a second area of the substrate which corresponds with another electrode of the at least two electrodes.

13. The method of claim 11, wherein each of the at least two electrodes is coupled to a power source through a switch.

14. The method of claim 13, wherein the creating the voltage difference between the showerhead and the one electrode of the at least two electrodes comprises connecting the one electrode of the at least two electrodes to the power source.

15. The method of claim 14, further comprising:
disconnecting the one electrode of the at least two electrodes from the power source;
connecting another electrode of the at least two electrodes to the power source; and
creating a voltage difference between the showerhead and the other of the at least two electrodes to create a plasma substantially contained in the second area of the substrate.

16. A method for processing a substrate, the method comprising:
providing a substrate disposed on a pedestal, the pedestal comprising a first electrode and a second electrode embedded therein, wherein a first region of the substrate is positioned above the first electrode and a second region of the substrate is positioned above the second electrode;
providing a showerhead above the pedestal;
delivering a plasma gas to a processing region between the substrate and the showerhead; and
selectively connecting a power source to one of the first electrode or the second electrode to create a voltage difference between the showerhead and the one of the first electrode or the second electrode to create a plasma after the delivery of the plasma gas to the processing region, the plasma being substantially contained above one of the first region or the second region of the substrate.

17. The method of claim 16, further comprising:
depositing a first material above the one of the first region or the second region of the substrate using the plasma;
delivering a non-plasma reagent into the processing region; and
depositing a second material above the other of the first region or the second region of the substrate using the non-plasma reagent.

18. The method of claim 17, wherein at least one of the first material or the second material is deposited using plasma-enhanced chemical vapor deposition (PECVD) or plasma-enhanced atomic layer deposition (PEALD).

19. The method of claim 18, wherein the depositing the second material above the other of the first region or the second region of the substrate using the non-plasma reagent occurs during the depositing the first material above the one of the first region or the second region of the substrate.

20. The method of claim 16, further comprising:
disconnecting the one of the first electrode or the second electrode from the power source;
connecting the other of the first electrode or the second electrode to the power source; and
creating a voltage difference between the showerhead and the other of the first electrode or the second electrode to create a plasma substantially contained above the other of the first region or the second region of the substrate.

* * * * *